US010592440B2

(12) United States Patent
Ma et al.

(10) Patent No.: US 10,592,440 B2
(45) Date of Patent: Mar. 17, 2020

(54) SYSTEM AND METHOD FOR FILTERING FIELD PROGRAMMABLE GATE ARRAY INPUT/OUTPUT

(71) Applicant: Oracle International Corporation, Redwood Shores, CA (US)

(72) Inventors: Xianda Ma, Cupertino, CA (US); Michael David Derbish, Pleasanton, CA (US); Cornelia Luise Edeltraut Koch-Stoschek, Palo Alto, CA (US); Rambabu Lolabattu, San Jose, CA (US); Simon yiu hoi Poon, San Jose, CA (US); Cheng Yang, Cupertino, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 16/281,416

(22) Filed: Feb. 21, 2019

(65) Prior Publication Data
US 2019/0188160 A1 Jun. 20, 2019

Related U.S. Application Data

(63) Continuation of application No. 15/182,005, filed on Jun. 14, 2016, now Pat. No. 10,248,585.

(51) Int. Cl.
H03K 19/177 (2020.01)
G06F 13/16 (2006.01)
G06F 13/42 (2006.01)
H03K 19/1776 (2020.01)
G06F 11/30 (2006.01)

(52) U.S. Cl.
CPC .............. *G06F 13/16* (2013.01); *G06F 11/30* (2013.01); *G06F 13/4282* (2013.01); *H03K 19/1776* (2013.01)

(58) Field of Classification Search
None
See application file for complete search history.

(56) References Cited

U.S. PATENT DOCUMENTS 5,745,734 A * 4/1998 Craft ................... H03M 7/3084
326/38
6,434,735 B1 8/2002 Watkins
6,754,882 B1 6/2004 Sanchez et al.
(Continued)

OTHER PUBLICATIONS

U.S. Appl. No. 15/182,005, "Non Final Office Action", dated Jul. 13, 2018, 9 pages.
(Continued)

*Primary Examiner* — Elias Mamo
(74) *Attorney, Agent, or Firm* — Kilpatrick Townsend & Stockton LLP

(57) ABSTRACT

Systems and methods for adding a logic layer between FPGA I/O and the core logic of the FPGA. With the extra layer, users can monitor and/or modify the I/O to the FPGA. In addition, users can monitor and/or modify input/output to the core logics of the FPGA, thereby filtering both I/O to the FPGA and the logic blocks of the FPGA. With the filtering in place, a non-intrusive digital scope can be implemented which can, in turn, be used to create a "black box" regarding FPGA I/O during the occurrence of the catastrophic events within the system.

17 Claims, 6 Drawing Sheets

(56) References Cited

U.S. PATENT DOCUMENTS

| | | | |
|---|---|---|---|
| 6,996,443 B2* | 2/2006 | Marshall | G06F 11/142 |
| | | | 700/87 |
| 7,260,794 B2 | 8/2007 | Butts | |
| 7,584,345 B2 | 9/2009 | Doering et al. | |
| 7,594,226 B2 | 9/2009 | Stelzer et al. | |
| 8,131,659 B2* | 3/2012 | Xu | G06N 3/063 |
| | | | 706/15 |
| 9,217,774 B2 | 12/2015 | Foisy et al. | |
| 9,418,187 B2 | 8/2016 | Foisy et al. | |
| 9,495,492 B1* | 11/2016 | Ramabadran | G06F 17/5031 |
| 9,525,421 B2 | 12/2016 | Potluri | |
| 2003/0218479 A1* | 11/2003 | Feng | G06F 17/5054 |
| | | | 326/41 |
| 2004/0060032 A1* | 3/2004 | McCubbrey | G06F 17/5054 |
| | | | 716/104 |
| 2017/0357603 A1 | 12/2017 | Ma et al. | |

OTHER PUBLICATIONS

U.S. Appl. No. 15/182,005, "Notice of Allowance", dated Nov. 19, 2018, 7 pages.

* cited by examiner

SYSTEM AND METHOD FOR FILTERING FIELD PROGRAMMABLE GATE ARRAY INPUT/OUTPUT

CROSS-REFERENCE TO RELATED APPLICATION

The present application is a continuation of, and claims the benefit and priority to U.S. application Ser. No. 15/182,005, filed Jun. 14, 2016, entitled "SYSTEM AND METHOD FOR FILTERING FIELD PROGRAMMABLE GATE ARRAY INPUT/OUTPUT, the entire contents of which is hereby incorporated by reference for all purposes

BACKGROUND

1. Technical Field

The present disclosure relates to filtering the input/output (I/O) of a Field Programmable Gate Array (FPGA), and more specifically to adding a logic layer between the FPGA I/O and the core logics of the FPGA.

2. Introduction

FPGAs are integrated circuits which can be configured by users after manufacturing. Each FPGA contains I/O (generally in the form of pins), programmable logic blocks, and programmable routing which connects the logic blocks to one another and the I/O. Users develop FPGA logic programming codes using a Hardware Description Language, such as VHDL or Verilog, use EDA (Electronic Design Automation) tools to compile and synthesize the codes into FPGA programming specific to an FPGA, and then upload that program into the FPGA for implementation. To verify the FPGA codes are operating correctly, users apply known inputs to the appropriate pins of the FPGA and compare resulting outputs to desired outputs, either in a simulation environment or in a live system.

BRIEF SUMMARY

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Disclosed are systems, methods, and non-transitory computer-readable storage media for adding a logic layer between the FPGA I/O and the core logic of the FPGA. With the extra logic layer, users can monitor and/or modify the I/O to the FPGA. In addition, users can monitor and/or modify input/output to the core logics of the FPGA.

To take advantage of the FPGA I/O connected to the filtering layer, a digital oscilloscope can be implemented. The digital oscilloscope can have options to select trigger signals, signal acquisition rate, triggering position, triggering polarity, and the ability to acquire and store all I/O connected to the filtering layer inside the FPGA blockRam. The acquired signals can then be fetched and viewed by users accessing the stored I/O from the FPGA using a CPU and bus connected to the FPGA.

When the digital oscilloscope is in place, a special operation mode can be implemented, where predefined events can trigger the digital oscilloscope to acquire the I/O signals, store the I/O signals in the FPGA blockRAM, generate a timestamp for the I/O collected, and send an interrupt signal to the CPU. After detecting the interrupt signal, the CPU can transfer the acquired signal samples to a non-volatile media, using the FPGA timestamp to tag the event with the CPU's epoch time. Thus all signals leading to catastrophic failure can be acquired and saved in a non-volatile medium, performing a function similar to the "blackbox" of an airplane.

Consider the following example. An FPGA can be loaded using a logic codes bitstream by a CPU, or loaded from a PROM (Programmable Read Only Memory), where the FPGA logic segments the FPGA into: a core logic layer and a filtering layer, wherein the filtering layer: receives Input/Output (I/O) associated with the core logic layer, and is configurable by the CPU to modify the I/O associated with the core logic layer.

The FPGA can receive the instructions for the I/O filtering layer logic via a bus (such as an $I^2C$ (Inter-Integrated Circuit), SPI (Serial Peripheral Interface), or other bus format) from the CPU. Users can then verify that the core logic is receiving and outputting correct data.

DETAILED DESCRIPTION

Figure 1:
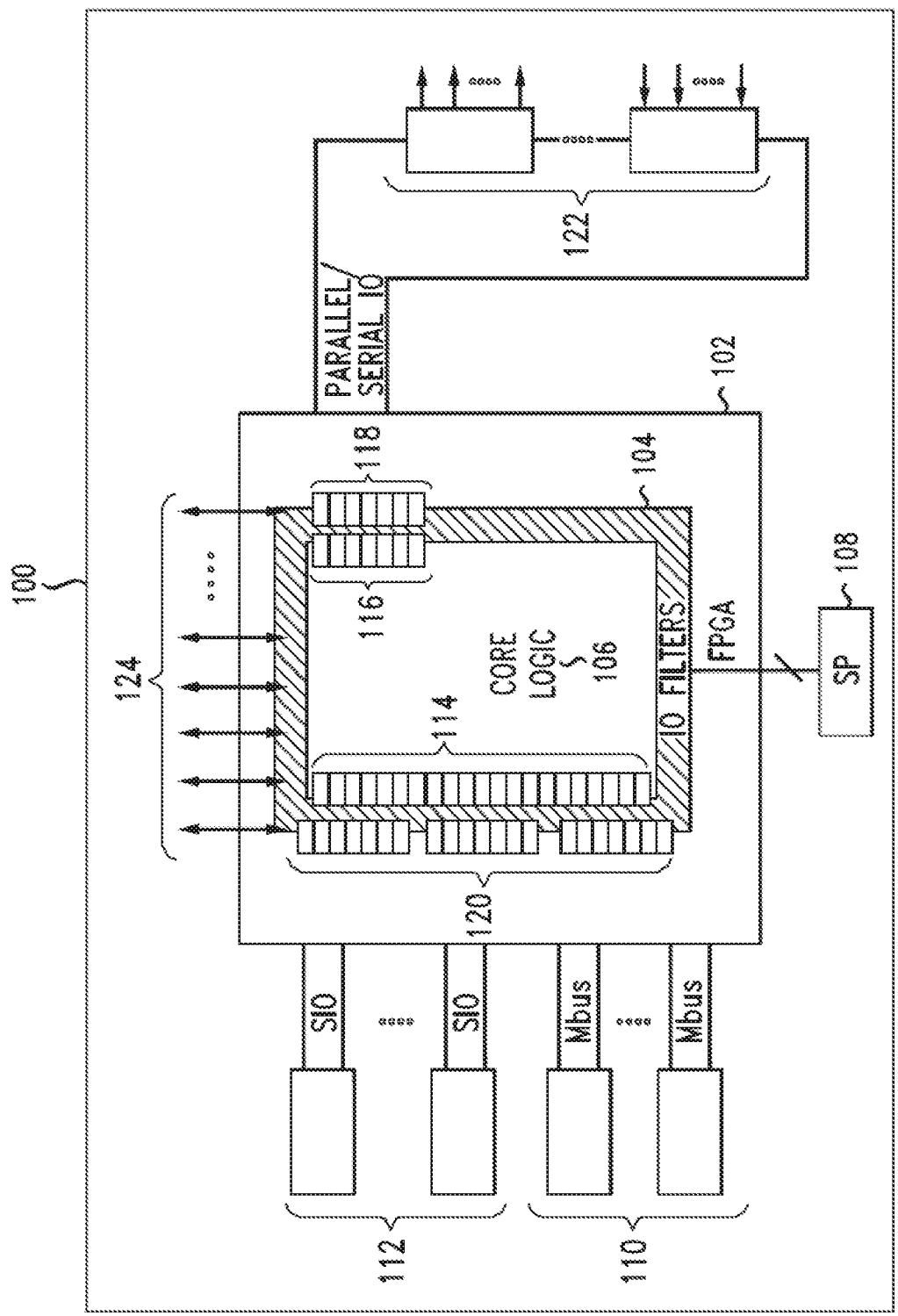
FIG. 1 illustrates an example of FPGA I/O filters.

A system, method and computer-readable media are disclosed which allows users to filter, monitor, and otherwise modify inputs and outputs to and from the core logic of an FPGA. This is achieved by programming the FPGA to have multiple logic layers. As data is received, a filtering layer within the FPGA can (1) receive the inputs to the pins of the FPGA, (2) modify/replace the inputs according to logic within the filtering layer, (3) communicate the FPGA inputs, or the filtered outputs of the filtering layer, to a core logic layer within the FPGA, (4) output the FPGA inputs and/or the outputs of the filtering layer to other connected devices. The core logic layer within the FPGA can receive the filtered outputs of the filtering layer, perform programmed logic functions using those outputs, and produce corresponding outputs. The outputs of the core logic layer can either pass through the filtering layer to FPGA pins without any change, or can be modified by the filtering layer prior to arriving at the FPGA pins.

Various embodiments of the disclosure are described in detail below. While specific implementations are described, it should be understood that this is done for illustration purposes only. Other components and configurations may be used without parting from the spirit and scope of the disclosure.

The disclosed systems and concepts provide improvement over industry standards such as JTAG (Joint Test Action Group), which can be used to test and debug FPGAs. Specifically, the hardware validation concepts disclosed herein can improve automation of hardware validation tests, introduce additional simulation/verification coverage, and create test cases for ILOM (Integrated Lights Out Manager).

Conventional JTAG interfaces with FPGAs have certain limitations the concepts disclosed herein improve upon. For example, JTAG only works with cells, whereas systems configured as disclosed herein communicate with I/O cells as well as internal registers which directly map to any I/O interfaces, such as serialized general I/O interfaces. Furthermore, the I/O filtering disclosed herein can load static and/or predefined signal patterns (such as a positive pulse or a negative pulse), whereas the JTAG is only capable of loading static values to the I/O of the FPGA. In addition, the I/O filtering disclosed herein can load I/O cell output, read I/O cell input, and/or replace I/O cell input. As yet another improvement, JTAG uses a TAP (Test Access Port) controller, while the I/O filtering disclosed herein can adapt to any host.

In addition, the digital scope implementation within the filter layer has certain advantage over other implementations. For example, in Xilinx® ChipScope™, the numbers of channels and how deep the acquisition channels can be are limited by the device resources. By contrast, embodiments configured as disclosed herein can capture over 400 channels simultaneously, where each channel has 2048 sampling points. In addition, the digital scope implementation disclosed herein can use any I/O signals received, as well as internal registers, as a digital scope trigger, with the additional flexibility that a user can choose a trigger in real-time, without any need to re-compile the FPGA design. Such digital scope features require no extra hardware components to set up the digital scope and/or read back the captured signals, making such filtering layers suited for use as an engineering tool in the laboratory as well as a service tool in the field.

By setting the digital oscilloscope to be triggered for certain events, including catastrophic events, systems configured according to this disclosure effectively implement a "black box," for the FPGA. Some of the advantages of a black box implementation can include: improving failure analysis by using hardware parameters captured prior to hardware failure; allowing failure analysis engineers to replay the hardware event without recreating the failure itself; and storing multiple sets of parameters and hardware failures with which a unified timeline of the system can be created, and which can be used for identifying failure correlations.

Having discussed some non-limiting, exemplary advantages of how the disclosed concepts improve on the art, the disclosure turns to discussing exemplary embodiments and configurations of systems and methods. These variations shall be described herein as the various embodiments are set forth. The disclosure now turns to FIG. 1.

FIG. 1 illustrates an example 100 of FPGA I/O filters 104 being implemented on an FPGA 102. FPGAs, like other integrated circuits, have physical pins connecting the device to other devices on a board. The physical pins of the example FPGA 102 are elements 120, 118, with possible connections to Serial I/O 112, Mbus (Similar to Serial I/O, but with frame CRC (Cyclic Redundancy Check) protection) I/O 110, Parallel/Serial I/O 122, or other I/O resources 124. The FPGA 102 can likewise be in communication with a Service Processor (SP) 108 via an I²C bus. Between the physical I/O 120, 118, 124 of the FPGA and core logic I/O 114, 116, a layer of filtering logic 104 is implemented.

In other words, as the FPGA is being programmed, the bit-stream/FPGA images used to program the FPGA can partition the FPGA into distinct sections: a filtering layer 104 and a core logic layer 106, where the core logic layer 106 performs the main calculations and computations required by the FPGA device, and a filtering layer 104 which "filters" the inputs and outputs both of the FPGA 102 and the core logic layer 106.

The filtering layer 104 can load input being provided to the FPGA by the FPGA pins, thereby "intercepting" it before the input is provided to the core logic. The filtering layer 104 can then pass the input on to the core logic 106, or modify and/or replace the input before sending it to the core logic 106, based on user configuration for each input. The filtering layer 104 can also pass the input from the core logic 106 to the FPGA output, or modify and/or replace the input before sending it to the FPGA 102 output. Such logic blocks within the filtering layer can be referred to as "filtering logic."

The filtering layer 104 can also act as a non-intrusive digital scope, outputting data which is being received/output by the FPGA 102, and/or outputting data from the core logic 106. For example, the outputs from the filtering layer 104 can be sampled and stored inside the FPGA blockRAM, then users can read the captured signal sampling points one signal a time by selecting the signal through the primary I²C device.

The digital oscilloscope features provide the user the capability to capture all the listed I/O signals, where each signal is captured in a predetermined number of points with sampling rate selectable from multiple sampling rates. For example, sampling rates can include 25 Mhz, 12.5 Mhz, 6.25 Mhz, 2.5 Mhz, 100 Khz, 10 Khz, 1 khz and 100 hz. This gives the user the capability to capture a chain of event of approximately 20 seconds when the predetermined number of points is 2048, with the understanding that this amount of time is directly related to the amount of data being captured.

The digital scope also enables the user to select any listed I/O signals as the triggering signals, or use I²C access to a specific register as the trigger event. Users can interact with the FPGA via the I²C bus connected SP (service processor) 108, thereby allowing the user to view inputs/outputs to the FPGA, as well as reset, program, and debug the FPGA. A user can specify when the FPGA begins to capture the I/O signal by specifying the trigger position within the 2048 sampling points. For example if the trigger position is 0, that shows the trigger is at the very beginning of the captured series of points, if trigger position is 2047, it means the trigger point is at the very end of the captured series of points.

To use the digital scope feature it is not required to set a global I/O filtering enable bit because the digital scope feature is a non-intrusive feature. However, a user can combine the digital scope feature with the I/O modification feature whenever the user thinks it is beneficial to his task.

The filtering can load static logic values and/or pre-defined signal patterns into/out of the core logic I/O. Examples of static logic values can include high or low voltages corresponding to a "1" or a "0". Examples of pre-defined signal patterns can include a positive pulse, a negative pulse, etc.

It can be desirable to verify how an FPGA will react in particular circumstances. With the filtering layer 104, users can provide specific inputs and test the FPGA logic to ensure it will react correctly when those inputs are received. For example, a user testing an FPGA on board could use the filtering layer to enter specific inputs indicating a hardware failure on the board, then view how the FPGA reacts based on that input. Non-limiting exemplary error conditions which an FPGA could receive include a host power fault, a power supply unit oversubscription, and a thermal trip event.

Figure 2:
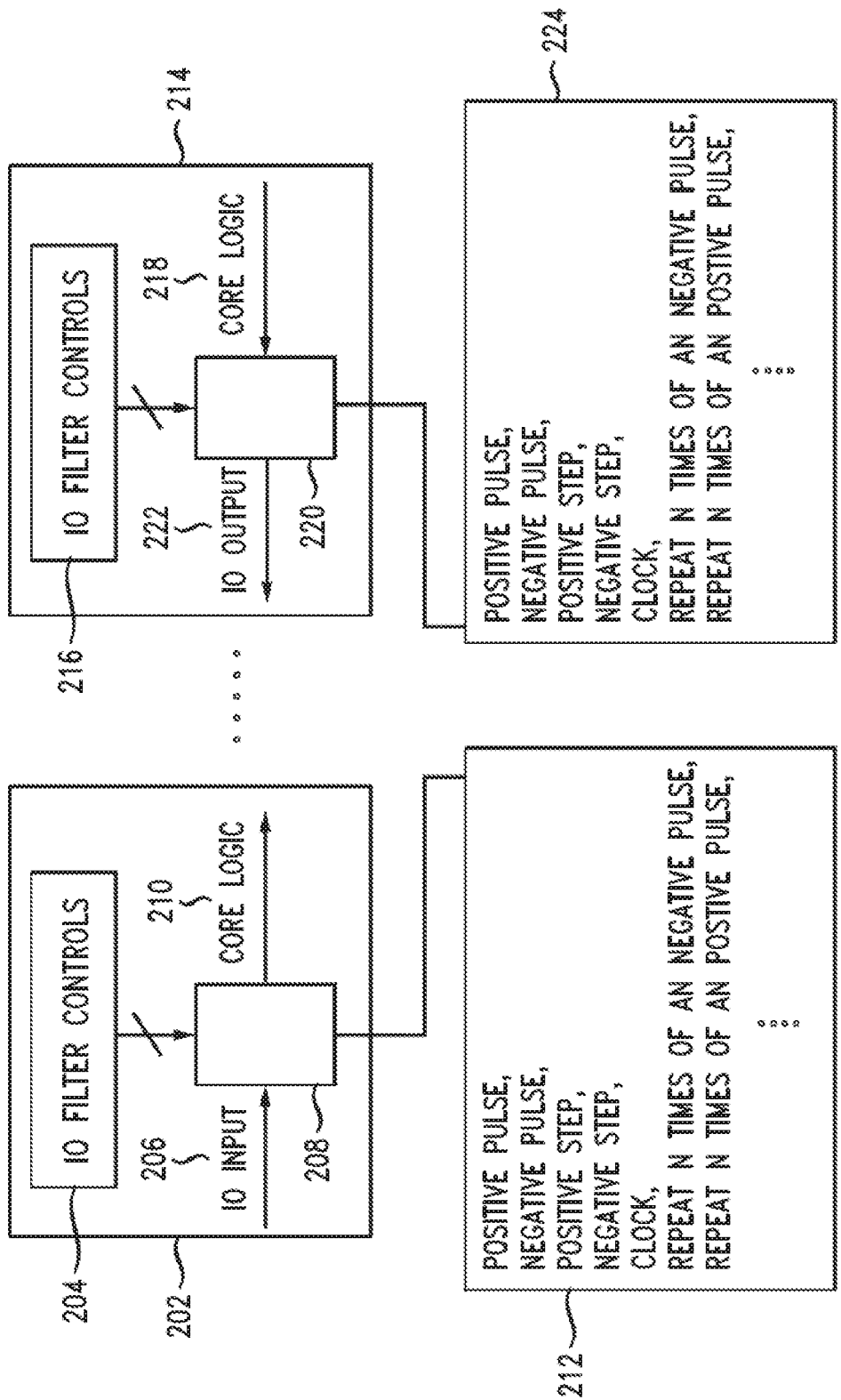
FIG. 2 illustrates functionality of FPGA I/O filters.

FIG. 2 illustrates functionality of FPGA I/O filters 208, 220. The left example 202 represents filtering of I/O input 206 via a filter layer 208 prior to the core logic 210 receiving the I/O input. The right-side example 214 represents filtering of I/O output 222 via a filter layer 220 after the core logic 218 has received and processed input data. The export filter layer 220 can have the same structure as the import filter layer 208. For resource sharing all I/O filtering can share one same stimulus library. For example, service processor SP 108 can configure I/O filter controls 204, 216 for both filter examples 202, 214 according user instructions. In addition, the filtering layer can either pass data through the filtering layer or can replace/modify the data. For example, the output from the I/O filter 208, 220 can be the same as the input 206, or 218 (i.e, the data can be passed through the filtering layer), or the output can be replaced by the chosen signal from the stimulus library 212, 224.

Figure 3:
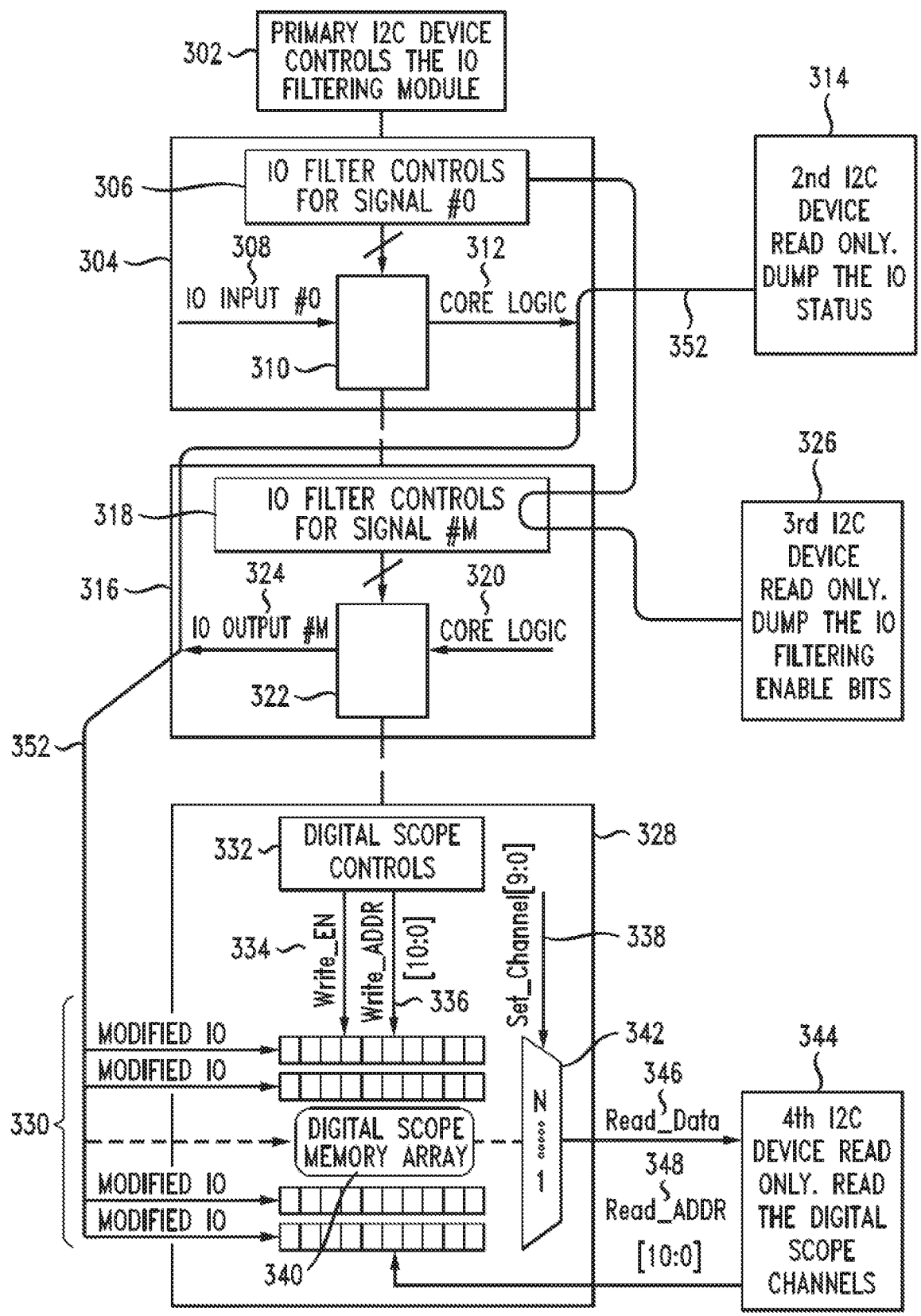
FIG. 3. illustrates $I^2C$ devices for I/O filtering a the digital oscilloscope implementation.

FIG. 3 illustrates I²C devices for I/O filtering a the digital oscilloscope implementation. By using an indirect access approach, a primary I²C device 302 inside a I/O filtering module can access an array of control and status registers for all the I/O signals. The primary I²C device 302 can also control other functions for this module. Consider the following example of how the registers on the primary I²C device can be configured.

IO Filtering module, Primary I²C device, Register 0x00

| Default | Bits | Field | Rules | Description |
|---|---|---|---|---|
| 0 | 7:0 | Signal#[7:0] | RW | Lower 8 bits of the IO signal # field of 12 bits |

IO Filtering module, Primary I²C device, Register 0x01

| Default | Bits | Field | Rules | Description |
|---|---|---|---|---|
| 0 | 3:0 | Signal#[11:8] | RW | Higher 4 bits of the IO signal # field of 12 bits |
| 0 | 7:4 | Reserved | RW | Reserved |

IO Filtering module, Primary I²C device, Register 0x02

| Default | Bits | Field | Rules | Description |
|---|---|---|---|---|
| 0 | 3:0 | Stimulus Source | RW | Select which waveform to replace the selected signal. First release will only enable logic high and low: |

| Stimulus Source | Waveform |
|---|---|
| 0 | 0 |
| 1 | 1 |
| 2 | 200 ns of logic low, then restored to the original signal. |
| 3 | 200 ns of logic high, then restored to the original signal. |
| Others | Reserved |

| Default | Bits | Field | Rules | Description |
|---|---|---|---|---|
| 0 | 4 | Original Signal | RO | The logic level of the original signal |
| 0 | 5 | Modified Signal | RO | The logic level of the modified signal |
| 0 | 6 | Reserved | RO | Reserved |
| 0 | 7 | Enable IO Filtering | RW | Set this bit to 1 is to enable to replace the original signal with the selected stimulus waveform. |

IO Filtering module, Primary I²C device, Register 0x03

| Default | Bits | Field | Rules | Description |
|---|---|---|---|---|
| 0 | 6:0 | Reserved | RO | Reserved |
| 1 | 7 | Write/Read | RW | When write 0 to this bit, it triggers the transferring the configuration defined by 0x02 to the signals selected by registers 0x00 and 0x01. When write 1 to this bit, it triggers the configuration and status read of the IO signals selected by registers 0x00 and 0x01 to register 0x02 |

IO Filtering module, Primary I²C device, Register 0x04

| Default | Bits | Field | Rules | Description |
|---|---|---|---|---|
| 0 | 6:0 | Reserved | RO | Reserved |
| 0 | 7 | IO Filtering Global Enable | RO | When this bit is set to 1, the IO filtering can be activated for each IO signals. User needs to write special codes to register 0xF0 to 0xF7 to set this bit. |

IO Filtering module, Primary I²C device, Register 0x05

| Default | Bits | Field | Rules | Description |
|---|---|---|---|---|
| 0 | 6:0 | Reserved | RO | Reserved |
| 0 | 7 | IO latch Trigger | WO | Write 1 to this bit, will latch all IO signals into another set of registers at the same time to be shifted out by reading the second I²C device |

IO Filtering module, Primary I²C device, Register 0xF0-0xF7

| Default | Bits | Field | Rules | Description |
|---|---|---|---|---|
| 00 | 7:0 | Reserved | WO | User writes special codes to these 8 registers to set the global IO filtering enable. When user writes 0 to register 0xF0, the global enable is disabled. When read these registers they always return 0. |

As illustrated in FIG. 2, the primary I²C device controls the filtering of the I/O to and from the core logic. In FIG. 3, this is further illustrated by both filtering the inputs to the FPGA 304 and filtering the outputs of the FPGA 316. With regard to filtering the inputs to the FPGA, this is done by a set of control signals from 306 from the primary device 302 which controls the filtering 310 for input signal #0, resulting in output sent to the core logic 312. With regard to filtering the outputs of the FPGA, this is done by a set of control signals from 318 from the primary device 302 for output signal #M, which instructs the filtering regarding the output of the core logic 320, resulting in filtered I/O output 324.

To facilitate easy verifying of the I/O values, a second I²C device 314 can be created. The second I²C device 314 is created to dump the I/O logic level (status). To dump the I/O logic level, the second device 314 is expected to latch the I/O signals at the same time they are produced, such that a cause-effect analysis can be done to debug problems. The I/O signal latch enable is done through the primary I²C device 302. Similarly, a third I²C device 326 can be created, where the third I²C device dumps the I/O filtering enable bits for all I/O signals.

Because all I/O goes through the filtering, a digital scope 328 can be implemented to monitor all I/O signals. The digital scope 328 can include of a digital scope control 332, digital scope memory array 340, and digital scope channel read device 344. Under scoping conditions, consider the following example, with the primary I²C device 302 at address 0x60, the second I²C device 314 at address 0x62, and the third I²C device 326 at address 0x64. The digital scope can store all I/O signals in the internal memory array 340. In order to read a specific channel through device 0x66, a user first selects the channel through device 0x60, register 0x19 (see below), and 0x1A (see below); then read the data from device 0x66, where in the readback I²C data each bit represents one acquired data point.

To set up the digital scope, a user writes specific parameters for a set of control registers in I/O filtering primary I²C device 302 with address 0x60. The following registers show relevant registers in device 0x60 in details:

| I/O Filtering module, Primary I²C device, Register 0x10, Digital Scope, Local Trigger Selector #0 | | | | |
|---|---|---|---|---|
| Default | Bits | Field | Rules | Description |
| 00 | 7:0 | Trigger Signal #0 | RW | Selected local trigger signal #0, lower 8 bits. Combined with lower 2 bits from register 0x11 to produce the full 10 bits of signal #0 as the digital scope trigger when scope trigger source is selected as a local signal. |

| I/O Filtering module, Primary I²C device, Register 0x11, Digital Scope, Local Trigger Selector #1 | | | | |
|---|---|---|---|---|
| Default | Bits | Field | Rules | Description |
| 00 | 1:0 | Trigger Signal #1 | RW | Selected local trigger signal #1, higher 2 bits. Combined with lower 8 bits from register 0x10 to produce the full 10 bits of signal #1 as the digital scope trigger when scope trigger source is selected as a local signal. |
| 00 | 7:2 | Reserved | RO | Reserved |

| I/O Filtering module, Primary I²C device, Register 0x12, Digital Scope Trigger Control | | | | |
|---|---|---|---|---|
| Default | Bits | Field | Rules | Description |
| 00 | 1:0 | Digital Scope Trigger Edge Selector | RW | Only applicable when local trigger is selected: 2'B00: Positive edge; 2'B01: Negative edge; 2'B10: Both positive and negative edges; 2'B11: Reserved. |
| 11 | 3:2 | Digital Scope Trigger Source Selector | RW | Select which source to use for the digital scope: 2'B00: Use the selected local trigger; 2'B01: Use the SP accessing the specific I²C register as the trigger; 2'B10: Use the trigger pulse from the Mbus as the local FPGA digital scope trigger. For SMOD, the triggers are the pulses generated any selected CMODs; while for CMODs, the trigger is from the pulse generated by SMOD. 3'B11: "Flight Black Box Mode". Once this mode is selected a pre-determined a set of events will be used for controlling the digital scope. More details in the "Flight Black Box Mode" sections. |
| 1 | 4 | Relay the Trigger Event | RW | If this is set to 1 in SMOD FPGA, the SMOD will relay the trigger pulse to all CMODs; while if it is set to 1 in CMOD FPGA, will relay the trigger pulse to SMOD when only the trigger source are local, by SP or in "Flight Black Box Mode" to break endless trigger loop. |
| 000 | 7:5 | Reserved | RO | Reserved |

| \multicolumn{5}{c}{I/O Filtering module, Primary I²C device, Register 0x13, Digital Scope, Trigger Position Register #0} |
| --- | --- | --- | --- | --- |
| Default | Bits | Field | Rules | Description |
| 00 | 7:0 | Trigger Position Register #0 | RW | The Digital scope has an exemplary depth of 2048 points, this register combined with register 0x14 forms the 11-bit position of the trigger in digital scope channels. These are the 8 lower bits. |

| \multicolumn{5}{c}{I/O Filtering module, Primary I²C device, Register 0x14, Digital Scope, Trigger Position Register #1} |
| --- | --- | --- | --- | --- |
| Default | Bits | Field | Rules | Description |
| 111 | 2:0 | Trigger Position Register #1 | RW | The Digital scope has depth of 2048 points, this register combined with register 0x13 forms the 11-bit position of the trigger in digital scope channels. These are the higher 3 bits. |
| 00 | 7:3 | Reserved | RO | Reserved |

| \multicolumn{5}{c}{I/O Filtering module, Primary I²C device, Register 0x15, Digital Scope, Sampling Rate Selector} |
| --- | --- | --- | --- | --- |
| Default | Bits | Field | Rules | Description |
| 1000 | 3:0 | Scope Sampling Rate Selector | RW | The digital scope runs at 25 Mhz for both SMOD and CMOD with acquisition depth of 2048 points. In order to cover more time lower sampling rates are also implemented: |
| | | | Value | Sampling Rate |
| | | | 0 | 25 Mhz: 40 ns |
| | | | 1 | 12.5 Mhz: 80 ns |
| | | | 2 | 6.25 Mhz: 160 ns |
| | | | 3 | 2.5 Mhz: 400 ns |
| | | | 4 | 100 Khz: 10 us |
| | | | 5 | 10 Khz: 100 us |
| | | | 6 | 1 Khz: 1 ms |
| | | | 7 | 100 hz: 10 ms |
| 00 | 7:4 | Reserved | RO | Reserved |

| \multicolumn{5}{c}{I/O Filtering module, Primary I²C device, Register 0x16, Digital Scope, Run Button} |
| --- | --- | --- | --- | --- |
| Default | Bits | Field | Rules | Description |
| 0 | 0 | Digital Scope Run Button | WO | Write 1 to this bit to start the digital scope acquisition. Readback is always zero |
| 00 | 7:1 | Reserved | RO | Reserved |

| \multicolumn{5}{c}{I/O Filtering module, Primary I²C device, Register 0x17, Digital Scope, Stop Button} |
| --- | --- | --- | --- | --- |
| Default | Bits | Field | Rules | Description |
| 0 | 0 | Digital Scope Stop Button | WO | Write 1 to this bit to stop the digital scope acquisition. Readback is always zero |
| 00 | 7:1 | Reserved | RO | Reserved |

| \multicolumn{5}{c}{I/O Filtering module, Primary I²C device, Register 0x18, Digital Scope, Acquisition Status} |
| --- | --- | --- | --- | --- |
| Default | Bits | Field | Rules | Description |
| 00 | 1:0 | Digital Scope Acquisition Status | RO | Indicating which state the digital scope is at: 00: Digital scope is at idle state; 01: Digital scope is at armed state- The digital scope is always running and acquiring data, but it is not being triggered yet; 10: Digital scope is at running state- The digital scope has already been triggered, and it is still acquiring data to fill in the memory array; 11: Digital scope is at finished state. The digital scope has finished the acquisition successfully. |
| 00 | 7:2 | Reserved | RO | Reserved |

| \multicolumn{5}{c}{I/O Filtering module, Primary I²C device, Register 0x19, Digital Scope, Read Channel Selector #0} |
| --- | --- | --- | --- | --- |
| Default | Bits | Field | Rules | Description |
| 00 | 7:0 | Read Channel Register #0 | RW | The Digital scope acquires samples for all listed signals. To get the stored samples out of the FPGA, user has to select which signal to be fetched, after that user can read the data from I²C device 0x66. These bits are the 8 lower bits for the signal #. |

| \multicolumn{5}{c}{I/O Filtering module, Primary I²C device, Register 0x1A, Digital Scope, Read Channel Selector #1} |
| --- | --- | --- | --- | --- |
| Default | Bits | Field | Rules | Description |
| 00 | 1:0 | Read Channel Register #1 | RW | The Digital scope acquires samples for all listed signals. To get the stored samples out of the FPGA, user has to select which signal to be fetched, after that user can read the data from I²C device 0x66. These bits are the 2 high bits for the signal #. |
| 00 | 7:2 | Reserved | RO | Reserved |

The primary I²C device 302 inside the I/O filtering holds the Control and Status Registers (CSR) for the digital scope operation. These include:
 a. Local Trigger Selector, 10-bit;
 b. Digital Scope Trigger Control, 8-bit;
 c. Trigger Position Register, 11-bit;
 d. Sampling Rate Selector, 4-bit;
 e. Run Button, 1-bit;
 f. Stop Button, 1-bit;

g. Acquisition Status, 2-bit;

h. Read Channel Selector, 10-bit.

Regarding the digital scope control block 332: this functional block takes the control signals from the primary I²C device 302, generates the digital scope memory write enable 334, write address 336, the starting address for the channel read 338, and the digital scope acquisition status.

Regarding the digital scope memory array 340: the memory arrays are created by utilizing the FPGA blockRAM. First a macro with 32-bit wide write/read data bus, 11-bit wide address bus, dual-port RAM can be created by a Xilinx Core Generator. Then multiple dual-port RAM macros can be connected to the digital scope control block 332 and digital scope channel read I²C device 344. Each I/O signal is connected to each of the write data bus bit, and each read data bus bit is connected to the N:1 multiplexer 342 that is controlled by the CSR "Read Channel Selector" 338. The output of the multiplexer 346 is then connected to the digital scope channel read I²C device 344.

Regarding the digital scope channel read I²C device 344. This functional block responds to the I²C access from the system, generates the digital scope memory array read address 348, and re-arrange the read-back data order suited for I²C access.

When the digital scope functions are in place, systems can be further configured to operate in a "Blackbox" mode, where predetermined system events of significance trigger recording of events for failure analysis. This is accomplished by the FPGA being hard-coded to use these pre-determined events as the digital scope triggers, to either record events proceeding the trigger or initiate recording of events.

Once the digital scope is set in this "Blackbox Mode", and is started by system software, the digital scope can run the following steps (the times, sample rates, and other values provided herein are exemplary only and are non-limiting):

(1) The digital scope starts to record all listed signals on every 10 us, with total sampling number of 2048 for each signal, (2) When the these blackbox trigger events occurs, (3) The digital scope latches the information to identify which blackbox trigger is fired, (4) The digital scope latches the current FPGA timestamp, (5) The digital scope keeps recording for another 256 samples, then stops recording;

(6) Then the digital scope generates an interrupt to the system software and indicates that the digital scope is successfully concluded.

After system software receives the blackbox interrupt, system software can transfer all the recorded signal samplings to a non-volatile storage for further failure analyzing. When system software reads back the latched blackbox timestamp, it can use this timestamp to correlate the blackbox samplings to other system events, and put them into a unified consistent system timeline. The captured hardware parameters are therefore securely stored in non-volatile media.

The blackbox feature is a special application case out of the FPGA digital scope. But there are a few extra CSR that are only applicable to the blackbox mode. The following CSR descriptions show what they are:

| I/O Filtering module, Primary I²C device, Register 0x1C, Digital Scope, Trigger Time Stamp Reg #0 | | | | |
|---|---|---|---|---|
| Default | Bits | Field | Rules | Description |
| 00 | 7:0 | Latched time stamp for Digital scope trigger, #0 | RO | The Event log time stamp at the moment of the digital scope trigger, bit 7 to 0. The combined latched event log time stamp [10:0] is in the unit of second. |

| I/O Filtering module, Primary I²C device, Register 0x1D, Digital Scope, Trigger Time Stamp Reg #1 | | | | |
|---|---|---|---|---|
| Default | Bits | Field | Rules | Description |
| 00 | 2:0 | Latched time stamp for Digital scope trigger, #1 | RO | The Event log time stamp at the moment of the digital scope trigger, bit 10 to 8. The combined latched event log time stamp [10:0] is in the unit of second. |
| 00 | 7:3 | Reserved | RO | Reserved |

| I/O Filtering module, Primary I²C device, Register 0x1E, Digital Scope, Blackbox trigger source | | | | |
|---|---|---|---|---|
| Default | Bits | Field | Rules | Description |
| 0 | 0 | Host Power Fault | RO | A logic high indicates the host power failure event triggers the blackbox. |
| 0 | 1 | PSU oversubscription | RO | A logic high indicates the PSU oversubscription event triggers the blackbox. |
| 0 | 2 | Thermal trip event to SP | RO | A logic high indicates the system thermal trip interrupt to SP triggers the blackbox. |
| 0 | 3 | Fan Blast | RO | A logic high indicates the system fan blasting event triggers the blackbox. |
| 0 | 4 | Mbus failure | RO | A logic high indicates the Mbus failure (CRC error) event triggers the blackbox. |
| 0 | 5 | CPU Proc Hot | RO | A logic high indicates the host CPU proc_hot_L event triggers the blackbox. |
| 0 | 6 | CPU Thermal trip | RO | A logic high indicates the host CPU thermal_L event triggers the blackbox. |

| | | I/O Filtering module, Primary I²C device, Register 0x1E, Digital Scope, Blackbox trigger source | | |
|---|---|---|---|---|
| Default | Bits | Field | Rules | Description |
| 0 | 7 | CPU CATERR or CPU ERR2 assertion | RO | A logic high indicates the host CPU CATERROR_L or CPU_ERROR2_L event triggers the blackbox. |

An 11-bit timestamp count inside the blackbox can increment in any desired time increments (for example, one second increments). When the timestamp count reaches full it can wrap around to zero, while at the same time the FPGA can generate an interrupt to the CPU. This allows the CPU to collaborate the timestamp zero with the CPU Epoch time (i.e., the timestamp is calibrated periodically to keep sync with CPU Epoch time). This allows the system to correctly keep track of time elapsed between consecutive events that are separated by one or more wraparounds of the 11-bit timestamp counter.

Figure 4:
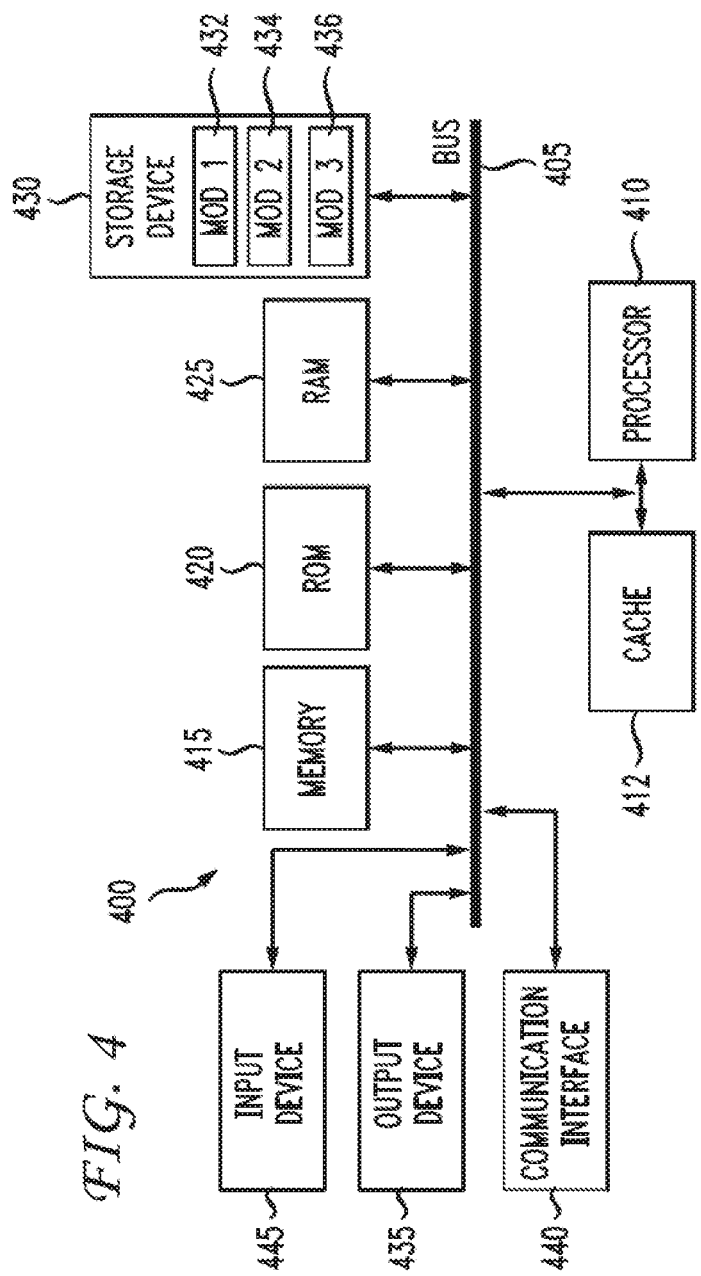
FIG. 4 illustrates a system embodiment.

FIG. 4 illustrates a general-purpose system or computing device 400 capable of performing the concepts disclosed herein, including a processing unit (CPU or processor) 410 and a system bus 405 that couples various system components including the system memory 415 such as read only memory (ROM) 420 and random access memory (RAM) 425 to the processor 410. The system 400 can include a cache 412 of high speed memory connected directly with, in close proximity to, or integrated as part of the processor 410. The system 400 copies data from the memory 415 and/or the storage device 430 to the cache 412 for quick access by the processor 410. In this way, the cache provides a performance boost that avoids processor 410 delays while waiting for data. These and other modules can control or be configured to control the processor 410 to perform various actions. Other system memory 415 may be available for use as well. The memory 415 can include multiple different types of memory with different performance characteristics. It can be appreciated that the disclosure may operate on a computing device 400 with more than one processor 410 or on a group or cluster of computing devices networked together to provide greater processing capability. The processor 410 can include any general purpose processor and a hardware module or software module, such as module 1 432, module 2 434, and module 3 436 stored in storage device 430, configured to control the processor 410 as well as a special-purpose processor where software instructions are incorporated into the actual processor design. The processor 410 may essentially be a completely self-contained computing system, containing multiple cores or processors, a bus, memory controller, cache, etc. A multi-core processor may be symmetric or asymmetric.

The system bus 405 may be any of several types of bus structures including a memory bus or memory controller, a peripheral bus, and a local bus using any of a variety of bus architectures. A basic input/output (BIOS) stored in ROM 420 or the like, may provide the basic routine that helps to transfer information between elements within the computing device 400, such as during start-up. The computing device 400 further includes storage devices 430 such as a hard disk drive, a magnetic disk drive, an optical disk drive, tape drive or the like. The storage device 430 can include software modules 432, 434, 436 for controlling the processor 410. Other hardware or software modules are contemplated. The storage device 430 is connected to the system bus 405 by a drive interface. The drives and the associated computer-readable storage media provide nonvolatile storage of computer-readable instructions, data structures, program modules and other data for the computing device 400. In one aspect, a hardware module that performs a particular function includes the software component stored in a tangible computer-readable storage medium in connection with the necessary hardware components, such as the processor 410, bus 405, display 435, and so forth, to carry out the function. In another aspect, the system can use a processor and computer-readable storage medium to store instructions which, when executed by the processor, cause the processor to perform a method or other specific actions. The basic components and appropriate variations are contemplated depending on the type of device, such as whether the device 400 is a small, handheld computing device, a desktop computer, or a computer server.

Although the exemplary embodiment described herein employs a hard disk, other types of computer-readable media which can store data that are accessible by a computer, such as magnetic cassettes, flash memory cards, digital versatile disks, cartridges, random access memories (RAMs) 425, and read only memory (ROM) 420, may also be used in the exemplary operating environment. Tangible computer-readable storage media, computer-readable storage devices, or computer-readable memory devices, expressly exclude media such as transitory waves, energy, carrier signals, electromagnetic waves, and signals per se.

To enable user interaction with the computing device 400, an input device 445 represents any number of input mechanisms, such as a microphone for speech, a touch-sensitive screen for gesture or graphical input, keyboard, mouse, motion input, speech and so forth. An output device 435 can also be one or more of a number of output mechanisms known to those of skill in the art. In some instances, multimodal systems enable a user to provide multiple types of input to communicate with the computing device 400. The communications interface 440 generally governs and manages the user input and system output. There is no restriction on operating on any particular hardware arrangement and therefore the basic features here may easily be substituted for improved hardware or firmware arrangements as they are developed.

For clarity of explanation, the illustrative system embodiment is presented as including individual functional blocks including functional blocks labeled as a "processor" or processor 410. The functions these blocks represent may be provided through the use of either shared or dedicated hardware, including, but not limited to, hardware capable of executing software and hardware, such as a processor 410, that is purpose-built to operate as an equivalent to software executing on a general purpose processor. For example the functions of one or more processors presented in FIG. 4 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) 420 for storing software performing the operations described below, and random access memory (RAM) 425 for storing results. Very large scale integration (VLSI) hardware embodiments, as well as custom VLSI circuitry in combination with a general purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system 400 shown in FIG. 4 can practice all or part of the recited methods, can be a part of the recited systems, and/or can operate according to instructions in the recited tangible computer-readable storage media. Such logical operations can be implemented as modules configured to control the processor 410 to perform particular functions according to the programming of the module. For example, FIG. 4 illustrates three modules Mod1 432, Mod2 434 and Mod3 436 which are modules configured to control the processor 410. These modules may be stored on the storage device 130 and loaded into RAM 425 or memory 415 at runtime or may be stored in other computer-readable memory locations.

Figure 5:
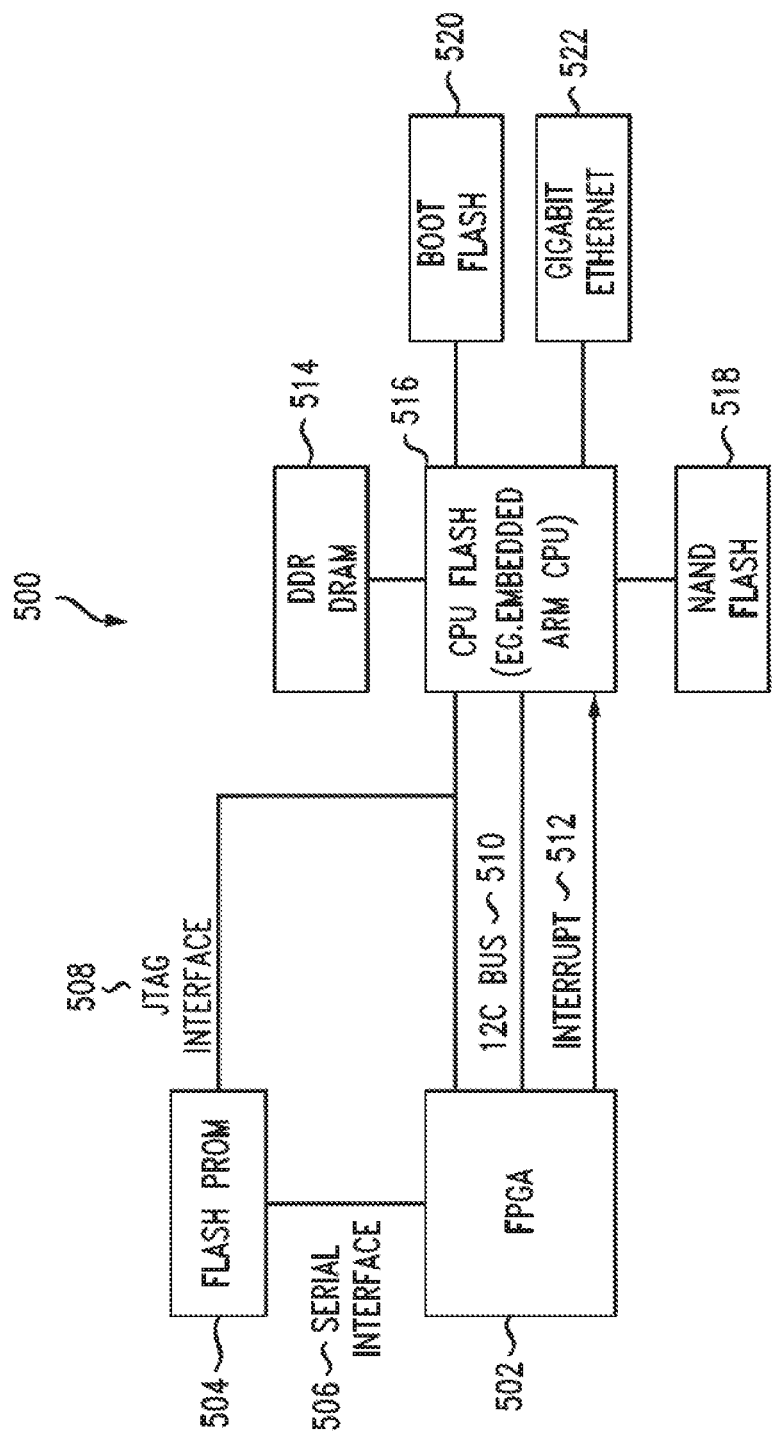
FIG. 5. illustrates an exemplary FPGA environment.

FIG. 5 illustrates an exemplary FPGA environment 500, where a CPU 516 interacts with an FPGA 502 via an I$^2$C bus 510. The processing unit 516 interacts with components such as DDR DRAM 514, boot flash 520 to store the BIOS and firmware, NAND flash 518 as a non-volatile storage medium, a Gigabit Ethernet port 522 to a network (thereby allowing users to login to the system). The embedded CPU 516 may also include a JTAG interface 508 which can directly load an FPGA image to the FPGA 502, or alternatively, can load the FPGA image to a flash PROM 504 and subsequently load the FPGA 502 via a serial interface 506. The I$_2$C bus 510 between the CPU 516 and FPGA 502 can provide the CPU 516 a configuration path for FPGA I/O filtering CRS, where the FPGA 502 can also generate various interrupts 512 to the CPU 516 upon detection of certain events.

Figure 6:
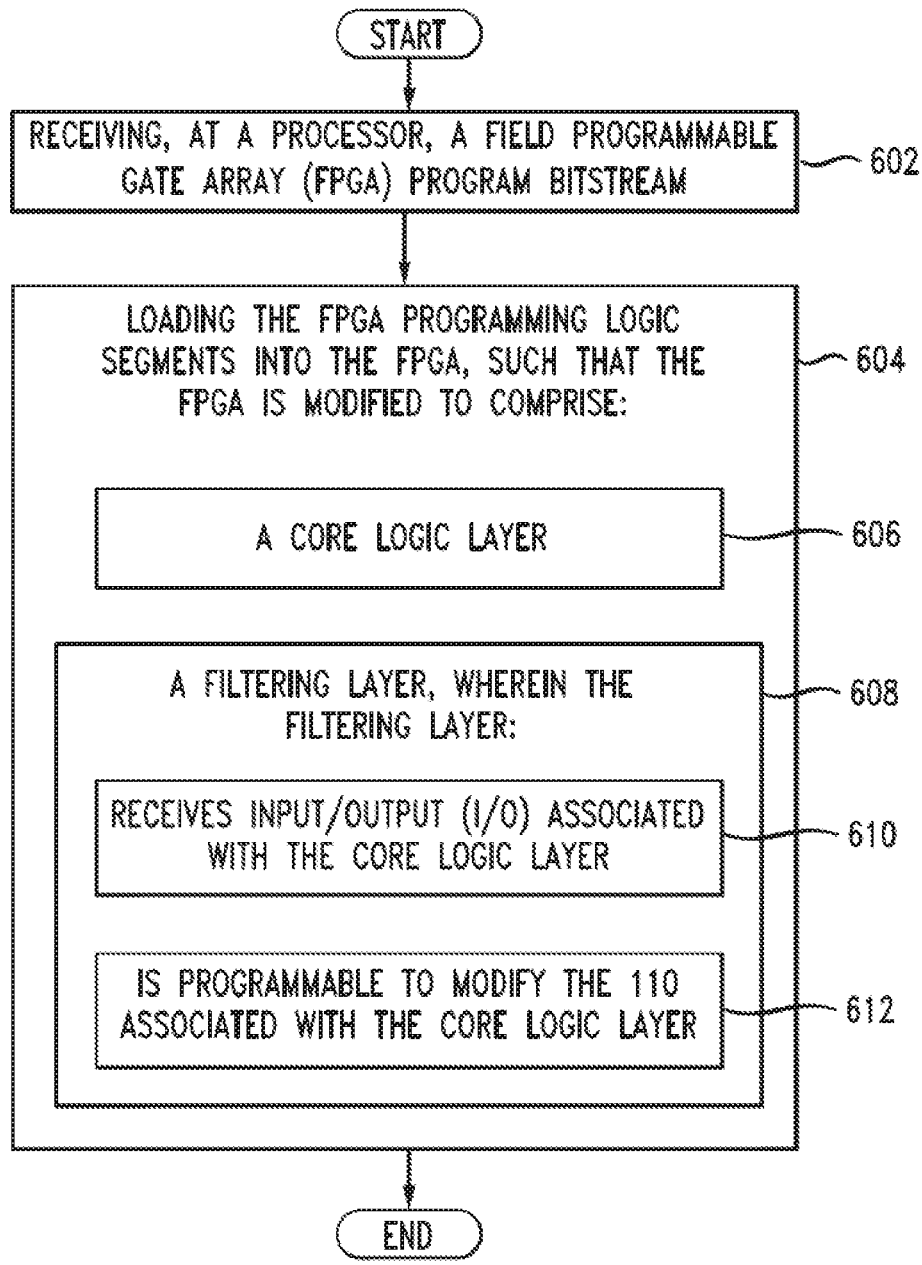
FIG. 6. illustrates an example method embodiment.

The disclosure now turns to the exemplary method embodiment shown in FIG. 6. For the sake of clarity, the method is described in terms of an exemplary system 400 as shown in FIG. 4 configured to practice the method. The steps outlined herein are exemplary and can be implemented in any combination thereof, including combinations that exclude, add, or modify certain steps.

The system 400 receives, at a processor, a Field Programmable Gate Array (FPGA) program bitstream (502), to yield FPGA programming logic segments. The system 400 loads the FPGA programming logic segments into an FPGA, such that the FPGA is modified to comprise (604): a core logic layer (606); and a filtering layer, wherein the filtering layer (608): receives Input/Output (I/O) associated with the core logic layer (610); and is programmable to modify the I/O associated with the core logic layer (612).

The I/O can, for example, include signals associated with pins of the FPGA, signals embedded inside a serial GPIO interface, and/or signals of or any other buses. The system 400 can pass data through the filtering layer and/or modify the data coming through the filtering layer. For example, the system 400 can replace the I/O with a set of pre-defined signal patterns.

The system 400 can act as a digital oscilloscope or a "black box." For example, the system 400 can enable a user selectable trigger, and, upon detecting an occurrence of the user selectable trigger, sample the I/O and store the sampled I/O into a FPGA blockRAM.

Such digital oscilloscope/blackbox embodiments can be triggered upon detecting specific conditions, conditions which can be selected/set by a user. For example, the user selectable trigger can be an error condition. In addition, storing the sampled I/O can further include receiving a timestamp from the FPGA associated with the sampled I/O; receiving, at the processor and from the FPGA, an interrupt signal; and after receiving the interrupt signal, correlating the sampled I/O and the timestamp with an Epoch time of the processor. Such timestamps can be generated and calibrated by the processor periodically.

Embodiments within the scope of the present disclosure may also include tangible and/or non-transitory computer-readable storage media for carrying or having computer-executable instructions or data structures stored thereon. Such tangible computer-readable storage media can be any available media that can be accessed by a general purpose or special purpose computer, including the functional design of any special purpose processor as described above. By way of example, and not limitation, such tangible computer-readable media can include RAM, ROM, EEPROM, CD-ROM or other optical disk storage, magnetic disk storage or other magnetic storage devices, or any other medium which can be used to carry or store desired program code means in the form of computer-executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in standalone or network environments. Generally, program modules include routines, programs, components, data structures, objects, and the functions inherent in the design of special-purpose processors, etc., that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like.

Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

The various embodiments described above are provided by way of illustration only and should not be construed to limit the scope of the disclosure. For example, the principles herein apply FPGAs, but can also be applied to other field-programmable integrated circuits. Various modifications and changes may be made to the principles described herein without following the example embodiments and applications illustrated and described herein, and without departing from the spirit and scope of the disclosure.

What is claimed is:

1. A method comprising:
receiving a Field Programmable Gate Array (FPGA) program bit stream;
generating, based at least in part on the FPGA bit stream, a plurality of FPGA programming logic segments;
modifying, based at least in part on the FPGA programming logic segments, an FPGA to comprise a core logic layer and a filtering layer, wherein the filtering layer comprises a first set of logic blocks within the FPGA and the core logic layer comprises a second set of logic blocks within the FPGA, the first set of logic blocks being distinct from the second set of logic blocks;
receiving a first input associated with the core logic layer, wherein the first input is one or more predefined inputs; and
in response to determining that the first input is one or more of the predefined inputs:
storing an indication of the first input and a timestamp associated with the first input;
modifying the first input to prevent the first input from being received by the core logic layer; and
outputting, based at least in part by the FPGA, the indication of the first input to a display.

2. The method of claim 1, wherein the one or more predefined inputs comprise inputs that cause the core logic layer to output an erroneous value.

3. The method of claim 1, further comprising:
receiving, by the filtering layer, a second input associated with the core logic layer, the second input not being a part of the one or more predefined inputs; and
transmitting, by the filtering layer, the second input to the core logic layer.

4. The method of claim 1, wherein the first set of logic blocks are associated with pins at an exterior portion of the FPGA and the second set of logic blocks are associated with pins at an interior portion of the FPGA.

5. The method of claim 1, wherein the first input is generated by a service processor that is communicatively linked to the FPGA.

6. The method of claim 1, wherein the first input is received by the filtering layer by one or more FPGA pins in a first set of FPGA pins, wherein the first set of logic blocks operate on the first set of FPGA pins.

7. A system comprising:
a processor;
a Field Programmable Gate Array (FPGA); and
a computer-readable storage medium having instructions stored which, when executed by the processor, cause the processor to perform operations comprising:
receiving a FPGA program bit stream;
generating, based at least in part on the FPGA bit stream, a plurality of FPGA programming logic segments;
modifying, based at least in part on the FPGA programming logic segments, an FPGA to comprise a core logic layer and a filtering layer, wherein the filtering layer comprises a first set of logic blocks within the FPGA and the core logic layer comprises a second set of logic blocks within the FPGA, the first set of logic blocks being distinct from the second set of logic blocks;
receiving a first input associated with the core logic layer, wherein the first input is one or more predefined inputs; and
in response to determining that the first input is one or more of the predefined inputs:
storing an indication of the first input and a timestamp associated with the first input;
modifying the first input to prevent the first input from being received by the core logic layer; and
output the indication of the first input to a display.

8. The system of claim 7, wherein the one or more predefined inputs comprise inputs that cause the core logic layer to output an erroneous value.

9. The system of claim 7, the computer-readable storage medium having additional instructions stored which, when executed by the processor, cause the processor to perform operations comprising:
receiving, by the filtering layer, a second input associated with the core logic layer, the second input not being a part of the one or more predefined inputs; and
transmitting, by the filtering layer, the second input to the core logic layer.

10. The system of claim 7, wherein the first set of logic blocks are associated with pins at an exterior portion of the FPGA and the second set of logic blocks are associated with pins at an interior portion of the FPGA.

11. The system of claim 7, wherein the first input is generated by a service processor that is communicatively linked to the FPGA.

12. The system of claim 7, wherein the first input is received by the filtering layer by one or more FPGA pins in a first set of FPGA pins, wherein the first set of logic blocks operate on the first set of FPGA pins.

13. A computer-readable storage device having instructions stored which, when executed by a computing device, cause the computing device to perform operations comprising:
receiving a Field Programmable Gate Array (FPGA) program bit stream;
generating, based at least in part on the FPGA bit stream, a plurality of FPGA programming logic segments;
modifying, based at least in part on the FPGA programming logic segments, an FPGA to comprise a core logic layer and a filtering layer, wherein the filtering layer comprises a first set of logic blocks within the FPGA and the core logic layer comprises a second set of logic blocks within the FPGA, the first set of logic blocks being distinct from the second set of logic blocks;
receiving a first input associated with the core logic layer, wherein the first input is one or more predefined inputs; and
in response to determining that the first input is one or more of the predefined inputs:
storing an indication of the first input and a timestamp associated with the first input;
modifying the first input to prevent the first input from being received by the core logic layer; and
outputting the indication of the first input to a display.

14. The computer-readable storage device of claim 13, wherein the one or more predefined inputs comprise inputs that cause the core logic layer to output an erroneous value.

15. The computer-readable storage device of claim 13, the computer-readable storage device having additional instructions stored which, when executed by the computing device, cause the computing device to perform operations comprising:
   receiving, by the filtering layer, a second input associated with the core logic layer, the second input not being a part of the one or more predefined inputs; and
   transmitting, by the filtering layer, the second input to the core logic layer.

16. The computer-readable storage device of claim 13, wherein the first set of logic blocks are associated with pins at an exterior portion of the FPGA and the second set of logic blocks are associated with pins at an interior portion of the FPGA.

17. The computer-readable storage device of claim 13, wherein the first input is generated by a service processor that is communicatively linked to the FPGA.

* * * * *

UNITED STATES PATENT AND TRADEMARK OFFICE
CERTIFICATE OF CORRECTION

PATENT NO. : 10,592,440 B2
APPLICATION NO. : 16/281416
DATED : March 17, 2020
INVENTOR(S) : Ma et al.

It is certified that error appears in the above-identified patent and that said Letters Patent is hereby corrected as shown below:

In the Drawings

On sheet 2 of 6, in FIG. 2, under Reference Numeral 212, Line 7, delete "POSTIVE" and insert -- POSITIVE --, therefor.

On sheet 2 of 6, in FIG. 2, under Reference Numeral 224, Line 7, delete "POSTIVE" and insert -- POSITIVE --, therefor.

On sheet 5 of 6, in FIG. 5, under Reference Numeral 510, Line 1, delete "12C" and insert -- $I^2C$ --, therefor.

In the Specification

In Column 1, Line 13, after "purposes" insert -- . --.

In Column 2, Line 31, delete "a the" and insert -- the --, therefor.

In Column 5, Line 19, delete "a the" and insert -- the --, therefor.

In Column 11, Line 44, delete "recording;" and insert -- recording, --, therefor.

In Column 15, Line 40, delete "$I_2C$" and insert -- $I^2C$ --, therefor.

In Columns 16-17, Lines 63-67 (Column 16) 1-2 (Column 17), delete "Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices." and insert the same on Column 16, Line 62, as a continuation of the same paragraph.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*